United States Patent
Pyo et al.

(10) Patent No.: US 7,263,020 B2
(45) Date of Patent: Aug. 28, 2007

(54) MEMORY DEVICE CAPABLE OF REFRESHING DATA USING BUFFER AND REFRESH METHOD THEREOF

(75) Inventors: Suk-soo Pyo, Busan Metropolitan (KR); Hyun-taek Jung, Seoul (KR); Min-yeol Ha, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 102 days.

(21) Appl. No.: 11/256,879

(22) Filed: Oct. 24, 2005

(65) Prior Publication Data

US 2006/0087904 A1     Apr. 27, 2006

(30) Foreign Application Priority Data

Oct. 25, 2004   (KR) ............... 10-2004-0085382

(51) Int. Cl.
  *G11C 7/00*   (2006.01)
  *G11C 8/00*   (2006.01)
(52) U.S. Cl. ............... 365/222; 365/189.05; 365/195
(58) Field of Classification Search ........... 365/222, 365/189.05, 195, 230.03
  See application file for complete search history.

(56) References Cited

U.S. PATENT DOCUMENTS

| 6,449,685 | B1 | 9/2002 | Leung |
| 6,584,033 | B2* | 6/2003 | Ayukawa et al. ...... 365/230.03 |
| 6,707,743 | B2* | 3/2004 | Leung et al. ............... 365/222 |
| 6,757,784 | B2 | 6/2004 | Lu et al. |

FOREIGN PATENT DOCUMENTS

KR    1020020057307 A    7/2002

* cited by examiner

*Primary Examiner*—Son Dinh
(74) *Attorney, Agent, or Firm*—Myers Bigel Sibley & Sajovec PA

(57) ABSTRACT

An integrated circuit memory device includes a plurality of memories and a refresh controller within a memory system. The refresh controller is configured to generate a refresh request signal. The plurality of memories includes a plurality of banks of memory responsive to the refresh request signal. An additional memory includes a buffer unit configured to generate a refresh indication signal to a first one of the plurality of banks of memory and to receive buffer write data addressed to the first one of the plurality of banks of memory in response to receiving a refresh-access interrupt signal from the one of the plurality of banks of memory. The plurality of banks of memory and the buffer unit may be separate DRAM chips.

20 Claims, 5 Drawing Sheets

MEMORY DEVICE CAPABLE OF REFRESHING DATA USING BUFFER AND REFRESH METHOD THEREOF

RELATED APPLICATION

This application claims the priority of Korean Patent Application No. 10-2004-0085382, filed on Oct. 25, 2004, in the Korean Intellectual Property Office, the disclosure of which is hereby incorporated herein in its entirety by reference.

FIELD OF THE INVENTION

The present invention relates to memory devices and, more particularly, to memory devices that undergo periodic refresh operations.

BACKGROUND OF THE INVENTION

Random access memory devices that are widely used to store data in a computer are frequently classified as DRAMs (Dynamic RAMs) or SRAMs (Static RAMs). A DRAM includes a plurality of memory cells each consisting of a capacitor and a transistor, which store a single bit of data. Generally, a DRAM includes a plurality of banks of memory cells that are arranged in a row-column format. A bank may be composed of one or more DRAM blocks sharing timing control signals and memory cells arranged in a bank share address and control signal lines as well as data buses. Each bank acting as an independent chip has a row decoder and a column decoder and can operate independently as a DRAM.

Data, which has a high level ("1") or a low level ("0") according to the level of charges accumulated on a cell capacitor, is stored in a DRAM. However, since the charges accumulated on the capacitor are gradually discharged, determining the logic level of the data after a predetermined time may become difficult. Therefore, it is necessary to periodically perform refresh operations for amplifying and maintaining the stored data.

Here, a time measured from when the charges accumulated on the capacitor begins to be discharged to when the logic level ("0" or "1") of the data cannot be reliably determined is called a refresh period. The number to cycles taken to refresh all rows of a DRAM is called a refresh cycle. Also, a refresh interval is a time interval between refresh cycles when refresh operations are performed per a predetermined time.

The plurality of banks have the same configuration. In each bank, refreshing is performed row-by-row. Since each bank operates independently, while a read operation is performed in a bank, a write or refresh operation can be performed in another bank. FIG. 1 shows a conventional memory device 100 using a conventional refresh method. Referring to FIG. 1, the memory device 100 includes a refresh controller 110, a refresh-access arbitration unit 130, a cache 150 including a cache access unit CSA and a cache memory CSM, and a plurality of banks 170-0 through 170-(N-1) including bank access units BKA-0 through BKA-(N-1) and bank memories BKM-1 through BKM-(N-1), respectively.

The refresh controller 110 transmits a refresh request signal RQS for refreshing the plurality of banks 170-1 through 170-(N-1). The refresh-access arbitration unit 130 arbitrates refresh and access operations for the plurality of banks 170-0 through 170-(N-1). That is, the refresh-access arbitration unit 130 allows the plurality of banks 170-1 through 170-(N-1) to be refreshed if a refresh request is issued, and allows a specific bank to be accessed through a cache if an external access to the specific bank is requested. However, if an external access (a write access for writing data in a memory and a read access for reading data from a memory) and a refresh operation for a specific memory bank are simultaneously requested, the external access is limited, which deteriorates the performances of an entire system.

SUMMARY OF THE INVENTION

The present invention provides a memory device capable of performing a refresh operation by refreshing a memory bank while processing an external access to the memory bank using a buffer, when the external access and refresh operation for the same memory bank are simultaneously requested. The present invention also provides a refresh method capable of effectively performing a refresh operation by refreshing a memory bank while processing an external access to the memory bank using a buffer, when the external access and refresh operation for the same memory bank are simultaneously requested.

According to an aspect of the present invention, there is provided a memory device including a plurality of banks, a refresh controller, a buffer unit, and a storage unit. The refresh controller generates a refresh start signal for starting a refresh operation and a refresh request signal with a predetermined period. If a bank simultaneously receiving an external access request signal and the refresh request signal among a plurality of banks exists, the buffer unit generates a refresh indication signal indicating refreshing of the bank while processing the external access to the bank. The storage unit stores a buffer-bank address representing an address of a bank in which the same data as data stored in the buffer unit is stored and buffer data validity information indicating whether the data stored in the buffer unit is valid. The bank transmits a refresh-access interrupt signal to the buffer unit.

Each of the plurality of banks includes a bank memory and a bank controller. The bank controller includes a bank refresh controller and a bank access controller. The bank refresh controller generates a refresh address representing an address of a memory cell to be refreshed in the bank memory and outputs the refresh address and the refresh request signal. The bank access controller processes an external access to the bank memory or refreshes the memory cell corresponding to the refresh address, in response to the refresh request signal and/or the external access request signal.

The bank access controller includes a refresh-access arbitration unit, a refresh processor, and an external access processor. The refresh-access arbitration unit transmits the refresh-access interrupt signal to the buffer unit when simultaneously receiving the refresh request signal and the external access request signal, and generates a bank control signal controlling the operations of the bank memory. The control signal allows the bank memory to be refreshed in response to the refresh request signal, or allows an external access to the bank memory to be processed in response to the external access request signal, when the refresh request signal and the external access request signal are not simultaneously received. Also, the control signal controls an access between the bank memory and the buffer memory and allows the bank memory to be refreshed in response to the refresh indication signal, when the refresh request signal and the external access request signal are simultaneously received.

The buffer unit includes a buffer memory and a buffer controller. The buffer controller includes a buffer bank validity determination unit, a buffer data validity determination unit, and a buffer access controller. The buffer bank validity determination unit compares the buffer-bank address with the address of the bank, thus determining whether the buffer-bank address is valid, in response to the refresh-access interrupt signal. The buffer data validity determination unit determines whether data stored in the buffer unit is valid in response to the buffer data validity information, when it is determined that the buffer-bank address is valid. The buffer access controller processes the external access to the bank and transmitting the refresh indication signal to the bank, in response to determination results of the buffer bank validity determination unit and the buffer data validity determination unit.

According to another aspect of the present invention, there is provided a refresh method for controlling a refresh operation in a memory device including a plurality of banks and a buffer. After generating a refresh start signal, a refresh request signal is generated with a predetermined period. A determination is then made on whether a bank simultaneously receiving an external access request signal and the refresh request signal exists among the plurality of banks. If no bank simultaneously receives the external access request signal and the refresh request signal, then the plurality of banks are refreshed in response to the refresh request signal. However, if a bank simultaneously receiving the external access request signal and the refresh request signal exists, then a refresh-access interrupt signal is transmitted to the buffer unit and the bank is refreshed while allowing the buffer unit to process the external access.

According to an additional embodiment of the invention, an integrated circuit memory device is provided that includes a plurality of memories and a refresh controller within a memory system. The refresh controller is configured to generate a refresh request signal. The plurality of memories includes a plurality of banks of memory responsive to the refresh request signal. An additional memory is also provided that includes a buffer unit configured to generate a refresh indication signal to a first one of the plurality of banks of memory and receive buffer write data addressed to the first one of the plurality of banks of memory in response to receiving a refresh-access interrupt signal from the first one of the plurality of banks of memory. The plurality of banks of memory and the buffer unit may be separate DRAM chips.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
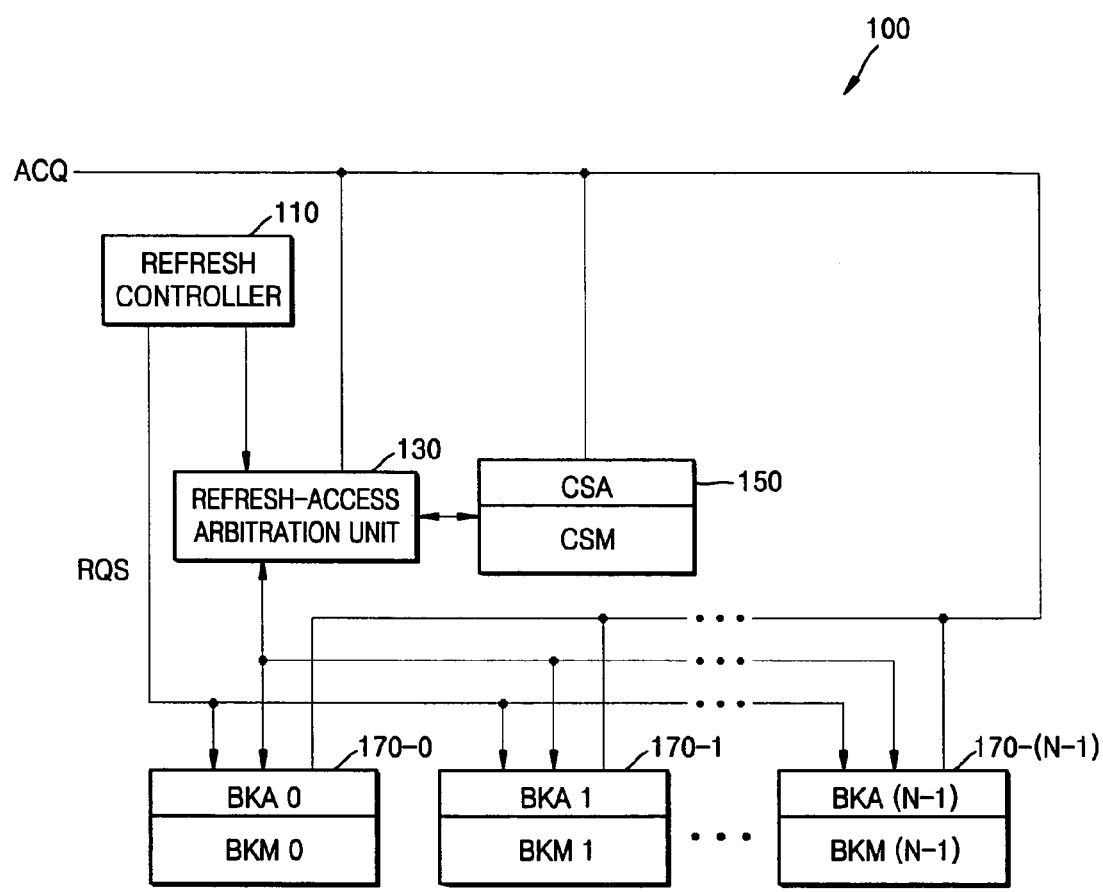
FIG. 1 is a block diagram of a conventional memory device.

The present invention now will be described more fully herein with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout and signal lines and signals thereon may be referred to by the same reference characters. Signals may also be synchronized and/or undergo minor Boolean operations (e.g., inversion) without being considered different signals.

Figure 2:
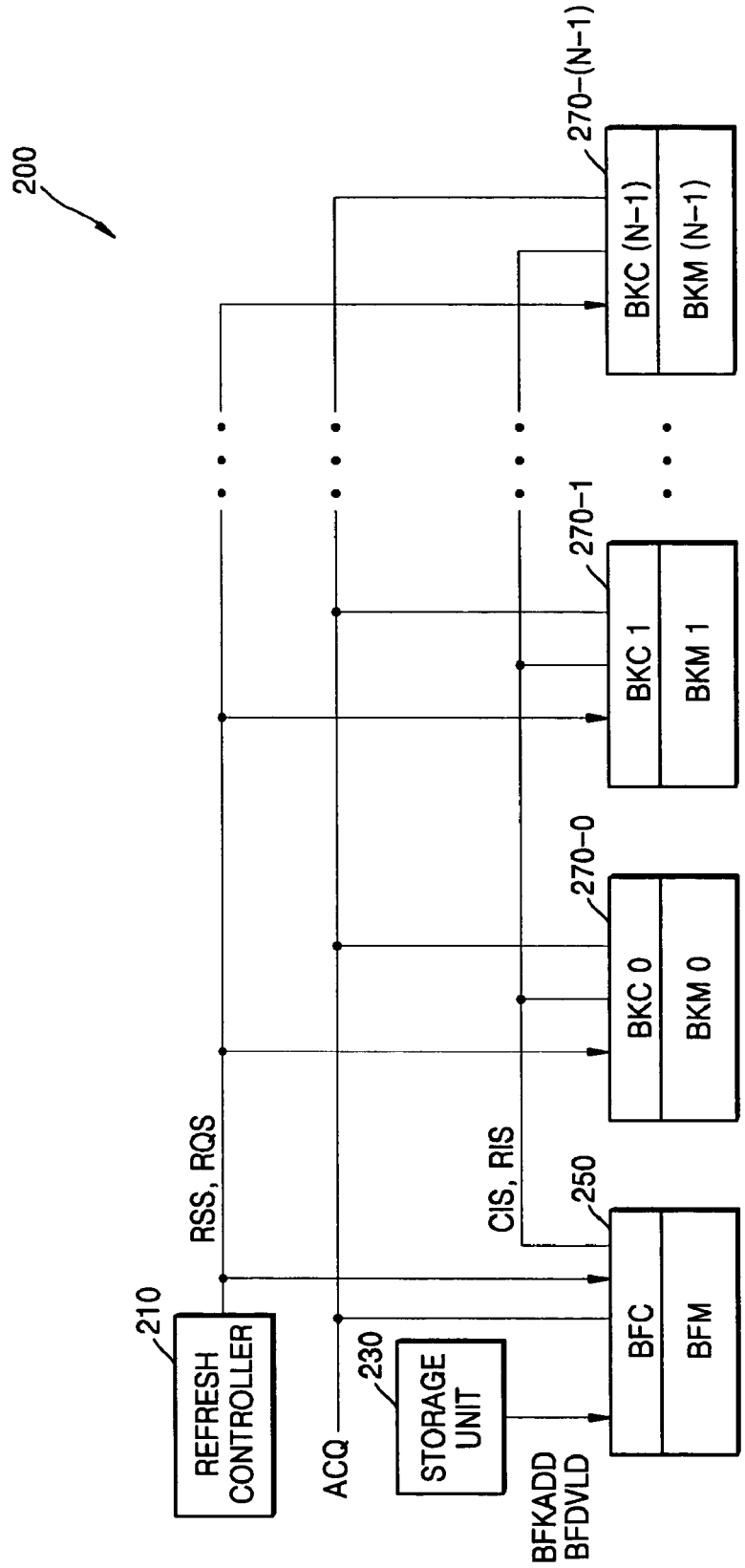
FIG. 2 is a block diagram of a memory device according to an embodiment of the present invention.

FIG. 2 is a block diagram of a memory device 200 according to an embodiment of the present invention. The memory device 200 includes a refresh controller 210, a storage unit 230, a buffer unit 250, and a plurality of banks 270 through 270-(N-1). The buffer unit 250 includes a buffer controller BFC and a buffer memory BFM. The respective banks 270-0 through 270-(N-1) include bank controllers BKC0 through BKC(N-1) and bank memories BKM0 through BKM(N-1), respectively. The buffer memory BFM can be implemented as a DRAM like the bank memories BKM0 through BKM(N-1), but may also be implemented as an SRAM. If the buffer memory BFM is implemented as a DRAM, the buffer memory BFM should be periodically refreshed. The buffer memory BFM performs refreshing first when a refresh request and an external access request for its buffer unit are simultaneously received.

The refresh controller 210 generates signals for refreshing the plurality of banks 270-0 through 270-(N-1) and the buffer unit 250 and transmits the signals to the respective banks 270-0 through 270-(N-1) and the buffer unit 250 via refresh buses. In the illustrated embodiment, the signals for refreshing include a refresh start signal RSS with a predetermined refresh period and a refresh request signal RQS with a predetermined period, however, other signals may also be generated.

Here, the predetermined refresh period should be set so that a next refresh start signal RSS can be transmitted before the logic level ("0" or "1") of data accumulated in a capacitor of a DRAM cell becomes unreadable due to discharge of the data bits. The predetermined period of a refresh request signal RQS should be set so that all predetermined refresh units in all the bank memories BKM0 through BKM(N-1) can be refreshed during the time interval between a refresh start signal RSS and a next refresh request signal RQS.

The predetermined refresh unit may be a row of the bank memories BKM0 through BKM(N-1) arranged in a row-column format. Generally, in a distributed refresh method, refreshing is performed per each row. In the present embodiment, the distributed refresh method in which a row is refreshed in response to a refresh request is used, however, the present invention is not limited to the distributed refresh method. The refresh request signal RQS is transmitted more frequently than the number of the rows of the bank memories BKM0 through BKM(N-1) during the predetermined refresh period.

Meanwhile, the external access signal is transmitted to the respective banks 270-0 through 270-(N-1) through external access buses. The external access signal includes an external access request signal ACQ for requesting an external access, a command signal indicating whether a requested external access signal is a signal requesting a write access or a signal requesting a read access, and all signals required for performing external accesses, such as addresses of banks or bank memories BKM0 through BKM(N-1) to which accesses are requested.

The plurality of banks 270-0 through 270-(N-1) include bank controllers BKC0 through BKC(N-1) for controlling the operations of the banks 270-0 through 270-(N-1) and bank memories BKM0 through BKM(N-1) for storing data, respectively. Each of the plurality of banks 270-0 through 270-(N-1) can independently process an external access and/or a refresh operation in response to an external access signal and/or a refresh request signal RQS. The respective bank controllers BKC0 through BKC(N-1) control external accesses and refresh operations for the respective bank memories BKM0 through BKM(N-1), respectively. If an external access and a refresh operation for each bank are not simultaneously requested, then the bank controllers BKC0 through BKC(N-1) will perform a requested operation independently. For example, if an external access to a specific bank is requested, a corresponding bank controller of the bank controllers BKC0 through BKC(N-1) processes the external access. If refreshing of a specific bank is requested, a corresponding bank controller of the bank controllers BKC0 through BKC(N-1) refreshes the specific bank. In the present embodiment, the external access is processed without using a cache, however, alternative embodiments may utilize a cache.

In contrast, if an external access and a refresh operation for a specific bank are simultaneously requested (that is, if an external access request signal ACQ and a refresh request signal RQS are simultaneously input to a specific bank), since the operations cannot be simultaneously performed within the selected bank, a corresponding bank controller will transmit a refresh-access interrupt signal CIS, which notifies that an external access and a refresh operation are simultaneously requested, to the buffer unit 250. The buffer unit 250 processes the requested external access in response to the refresh-access interrupt signal CIS and generates a refresh indication signal RIS for refreshing the specific bank, which ensures that a refresh operation will be performed in a timely manner.

The storage unit 230 stores buffer data validity information BFDVLD and buffer-bank address BFKADD. The buffer-bank address BFKADD is an address of a bank memory in which data corresponding to buffer data stored in a corresponding buffer memory is to be stored. The buffer data validity information BFDVLD is information indicating whether corresponding buffer data is valid.

The buffer unit 250 includes the buffer controller BFC and the buffer memory BFM. The buffer controller BFC first processes an external access to a specific bank to which the external access and the refresh operation are simultaneously requested, in response to the refresh-access interrupt signal CIS, generates a refresh indication signal RIS indicating refreshing of the specific bank, and transfers the refresh indication signal RIS to the specific bank. Then, the external access is processed by the buffer unit 250 on the basis of the buffer data validity information BFDVLD and the buffer-bank address BFKADD stored in the storage unit 230.

Figure 3:
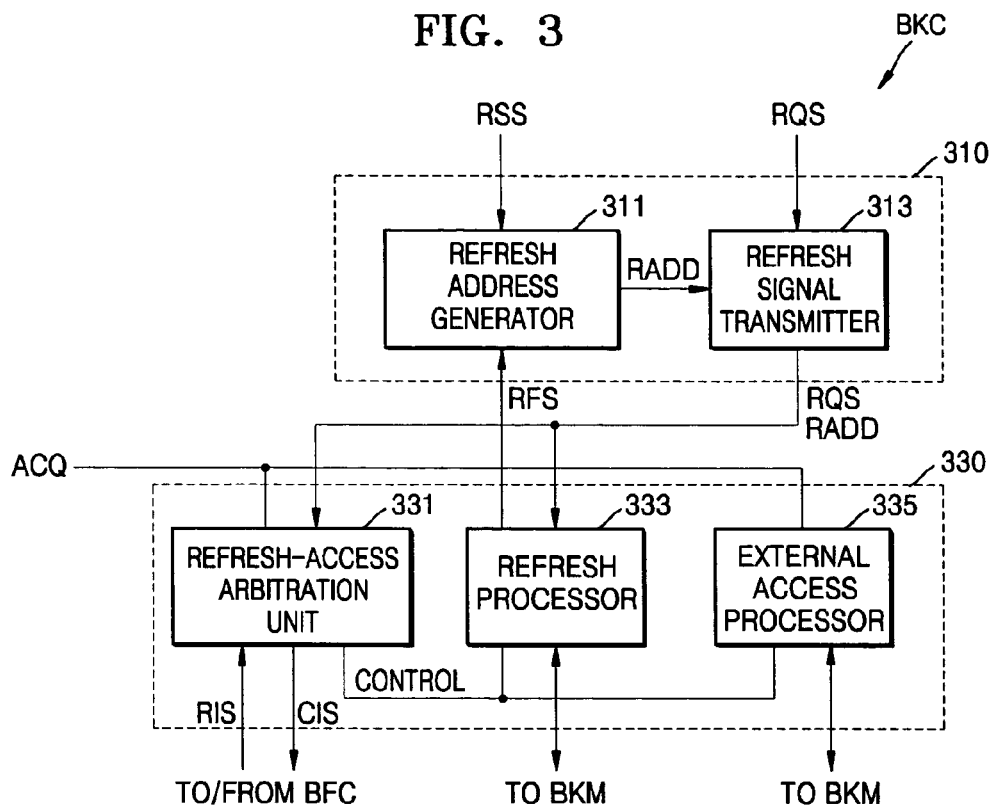
FIG. 3 is a block diagram of a bank controller of FIG. 2.

FIG. 3 is a block diagram of the bank controllers BKC0 through BKC(N-1) of FIG. 2. Each of the bank controllers BKC0 through BKC(N-1) includes a bank refresh controller 310 and a bank access controller 330. The bank refresh controller 310 includes a refresh address generator 311 and a refresh signal transmitter 313. The bank access controller 330 includes a refresh-access arbitration unit 331, a refresh processor 333, and an external access processor 335. The bank refresh controller 310 generates a signal RQS required for refreshing and transfers the signal to the bank access controller 330. The bank access controller 330 processes a refresh operation or an external access for a corresponding one of the bank memories BKM0 through BK(N-1) in response to the signal RQS transferred from the bank refresh controller 310 and an external access request signal ACQ.

In the present embodiment, the respective bank memories BKM0 through BKM(N-1) can be refreshed such that each row of each of the bank memories BKM0 through BKM(N-1) is sequentially refreshed by a refresh operation. The bank memories BKM0 through BKM(N-1) begin to be refreshed in response to a refresh start signal RSS. The refresh address generator 311 of FIG. 3 receives the refresh start signal RSS, generates an address (refresh address: RADD) of a row of a bank memory BKM0 through BKM(N-1) to be refreshed, and transmits the refresh address RADD to the refresh signal transmitter 313. The refresh address RADD is sequentially set from the first row of the bank memories BKM0 through BKM(N-1). That is, the refresh address generator 311 is reset in response to the refresh start signal RSS and transmits a refresh address RADD corresponding to the first row of the bank memories BKM0 through BKM(N-1) to the refresh signal transmitter 313. If refreshing of the first row of the bank memories BKM0 through BKM(N-1) is complete, the refresh processor 333 of the bank access controller 330 transmits a refresh completion signal RFS notifying that refreshing of the first row is complete, to the refresh address generator 311. The refresh address generator 311 then generates a refresh address RADD for the second row of the bank memories BKM0 through BKM(N-1) in response to the refresh completion signal RFS and transmits the next refresh address RADD to the refresh signal transmitter 313. In a similar sequential manner, the refresh address generator 311 generates refresh addresses RADD for all the rows of the bank memories BKM0 through BKM(N-1) and transmits the refresh addresses RADD to the refresh signal transmitter 313. After all the rows of the bank memories BKM0 through BKM(N-1) have been refreshed, the refresh address generator 311 no longer generates a refresh address RADD. Thereafter, when the refresh address generator 311 receives a refresh start signal RSS, the refresh address generator 311 is reset and the operations described above are repeated. In some embodiments of the invention, the refresh address generator 311 may be a counter, which is reset in response to a refresh start signal RSS. Upon reset, the counter will transmit a reset value as a refresh address RADD for the first row of the bank memories BKM0 through BKM(N-1), to the refresh signal transmitter 313. Then, if refreshing of the first row is complete, the refresh processor 333 of the bank access controller 330 transmits a refresh completion signal RFS to the refresh address generator 311. The counter counts to the next refresh address RADD in response to the refresh completion signal RFS, and transmits the updated count as a refresh address RADD for the second row of the bank memories BMK0 through BKM(N-1), to the refresh signal transmitter 313. Accordingly, the counter generates refresh addresses RADD for all the rows of the bank memories BKM0 through BKM(N-1) and transmits the refresh addresses RADD to the refresh signal transmitter 313. After all the rows of the bank memories BKM0 through BKM(N-1) are refreshed, the counter stops its counting operation, is reset in response to a new refresh start signal RSS, and then repeats the above-described operations.

The refresh signal transmitter 313 transmits the refresh address RADD received from the refresh address generator 311 and a refresh request signal RQS received from the refresh controller 210 to the bank access controller 330. The refresh-access arbitration unit 331 generates a control signal (control) for controlling refresh and access operations according to whether a refresh request signal RQS and an access request signal ACQ for the same bank are simultaneously received, and transmits the control signal to the refresh processor 333 and the external access processor 335. If refreshing of a corresponding bank is only requested, the refresh-access arbitration unit 331 allows the refresh processor 333 to refresh the corresponding bank, and if an external access to the corresponding bank is only requested, the refresh-access arbitration unit 331 allows the external access processor 335 to process the external access.

However, if a refresh operation and an external access for the same bank are simultaneously requested, the refresh-access arbitration unit 331 transmits a refresh-access interrupt signal CIS, which indicates that a refresh request and an external access request have been simultaneously received, to the buffer unit 250, in order to allow the buffer unit 250 to process the external access while the selected bank undergoes a refresh operation. The buffer unit 250 processes the external access on the basis of buffer-bank address BFKADD and buffer data validity information BFDVLD and generates a refresh indication signal RIS to indicate that refreshing of the corresponding bank should commence.

The refresh processor 333 refreshes a row of the bank memories BKM0 through BKM(N-1) corresponding to the refresh address RADD, in response to the refresh request signal RQS and the control signal control received from the refresh-access arbitration unit 331. The external access processor 335 processes the external access in response to the external access request (write or read) and the control signal received from the refresh-access arbitration unit 331. The external access may be an external write access or an external read access. An operation for processing the write and read accesses is well known by those skilled in the art, and therefore a detailed description of these operations is omitted.

Figure 4:
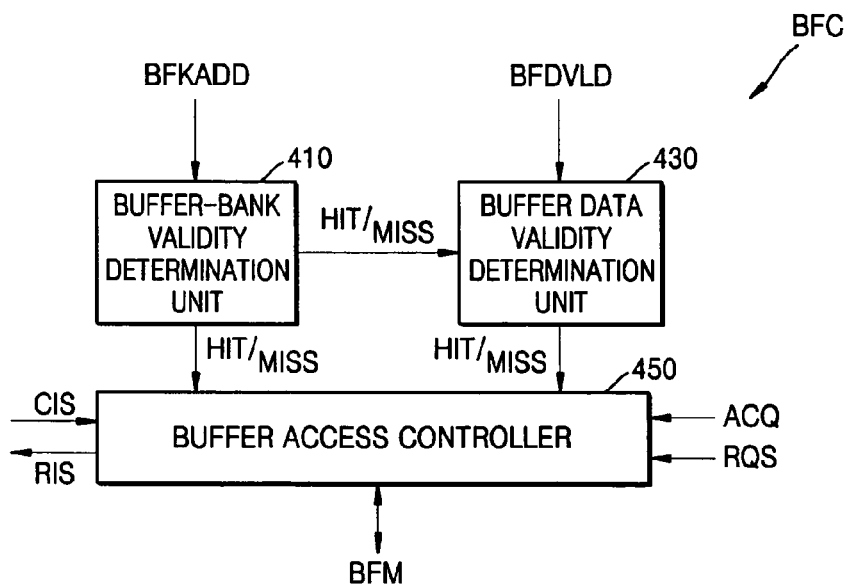
FIG. 4 is a block diagram of a buffer access unit of FIG. 2.

FIG. 4 is a block diagram of the buffer controller BFC of FIG. 2. The buffer controller BFC includes a buffer bank validity determination unit 410, a buffer data validity determination unit 430, and a buffer access controller 450. The buffer access controller 450 controls an operation for processing an external access on the basis of a buffer-bank address BFKADD and buffer data validity information BFDVLD and controls refreshing of a corresponding bank to which an external access and a refresh operation are simultaneously requested, in response to a refresh-access interrupt signal CIS. The buffer-bank validity determination unit 410 determines whether a buffer-bank address BFKADD stored in the storage unit 230 is equal to the address of a bank to which the external access is requested. If both the addresses are the same, the buffer-bank validity determination unit 410 outputs a buffer-bank hit signal. If the addresses are not the same, the buffer-bank validity determination unit 410 outputs a buffer-bank miss signal. The buffer data validity determination unit 430 determines whether buffer data in a buffer unit is valid based on the buffer data validity information BFDVLD, in response to the buffer-bank hit signal. If the buffer data is valid, the buffer data validity determination unit 430 outputs a buffer hit signal, and if the buffer data is invalid, the buffer data validity determination unit 430 outputs a buffer miss signal.

In the case of a write access, the buffer access controller 450 performs different operations according to outputs of the buffer bank validity determination unit 410. If the buffer bank validity determination unit 410 outputs a buffer bank hit signal, the buffer access controller 450 writes received external data into the buffer memory BFM.

In this manner, the buffer-bank validity determination unit 410 allows the buffer unit 250 to process the write access and simultaneously transmits a refresh indication signal RIS to a refresh-access arbitration unit 331 of a specific bank to which a refresh operation and an external access are simultaneously requested. The refresh-access arbitration unit 331 of the specific bank allows the refresh processor 333 to refresh a corresponding bank memory.

In contrast, if the buffer-bank validity determination unit 410 outputs a buffer bank miss signal, the buffer access controller 450 transmits present buffer data to a bank memory corresponding to a buffer-bank address BFKADD and requests the refresh-access arbitration unit 331 to store the buffer data in the bank memory. After the buffer data is stored in the bank memory, the buffer access controller 450 stores an address of a bank to which an external write access is requested in the storage unit, and transmits a refresh indication signal RIS to the refresh-access arbitration unit 331 of a specific bank to which a refresh operation and an external access are simultaneously requested while writing received external data in the buffer unit.

In the case of a read access, different operations are performed according to outputs of the buffer-bank validity determination unit 410 and the buffer data validity determination unit 430. The buffer data validity determination unit 430 determines whether the buffer data is valid in response to a buffer bank hit signal. If the buffer data is valid, the buffer data valid determination unit 430 outputs a buffer hit signal, and if the buffer data is invalid, the buffer data valid determination unit 430 outputs a buffer miss signal. If a buffer hit signal is received, the buffer access controller 450 outputs data stored in a buffer memory to the outside, and transmits a refresh indication signal RIS to a refresh-access arbitration unit 331 of a specific bank to which a refresh operation and an external access are simultaneously requested while processing the external read access. If a buffer miss signal is received, external read access processing similar with read access processing by a cache is performed. That is, the buffer access controller 450 requests data stored in an address of a bank to which a read access is requested, to the refresh-access arbitration unit 331, and stores the data stored in the bank in a corresponding address of the buffer memory BFM. After storing the data in the buffer memory BFM, the buffer access controller 450 outputs the data stored in the buffer memory BFM to the outside, and transmits a refresh indication signal RIS to a refresh-access arbitration unit 331 of a specific bank to which a refresh operation and an external access are simultaneously requested while processing the external read access.

Meanwhile, if a buffer-bank miss signal is received, the buffer access controller 450 transmits present buffer data to a bank memory of a bank corresponding to a buffer-bank address BFKADD, and requests the refresh-access arbitration unit 331 to store the buffer data in the bank memory. If the buffer data is stored in the bank memory, the buffer access controller 450 requests data stored in an address of a bank to which the read access is requested, to the refresh-access arbitration unit 331, and stores the data stored in the bank in a corresponding address of the buffer memory BFM. After the buffer data is stored in the buffer memory BFM, the buffer access controller 450 outputs the data stored in the buffer memory BFM to the outside, and transmits a refresh indication signal RIS to a refresh-access arbitration unit 331 of a specific bank to which a refresh operation and an external access are simultaneously requested while processing the external read access.

Figure 5:
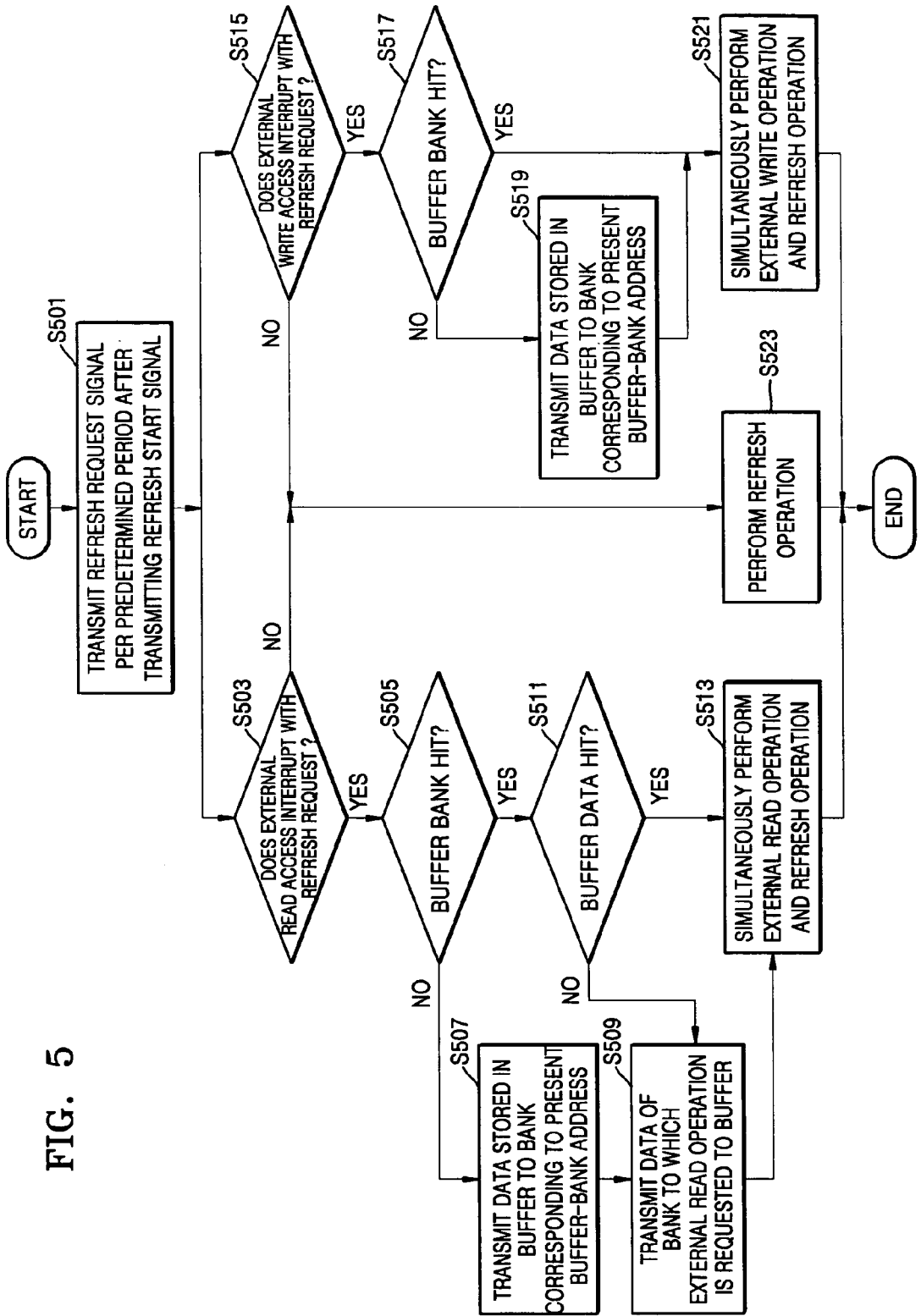
FIG. 5 is a flowchart illustrating a refresh method according to an embodiment of the present invention.

FIG. 5 is a flowchart illustrating a refresh method according to an embodiment of the present invention. The refresh method will be described in detail with reference to FIGS. 2 through 5. In order to refresh the plurality of banks 270-0 through 270-(N-1), first, the refresh controller 210 transmits a refresh start signal RSS to the plurality of banks 270-0 through 270-(N-1) to notify that a refresh operation starts, and then transmits a refresh request signal RQS with a predetermined period to the plurality of banks 270-0 through 270-(N-1) (operation S501). Meanwhile, each of the plurality of banks 270-0 through 270-(N-1) can receive an external access request signal ACQ as well as the refresh request signal RQS.

After receiving the refresh request signal RQS, each of the plurality of banks 270-0 through 270-(N-1) determines whether the refresh request signal RQS and an external request signal ACQ are simultaneously received (operations S503 and S515). If the refresh request signal RQS and the external access request signal ACQ are not simultaneously received, each of the plurality of banks 270-0 through 270-(N-1) processes an external excess or performs a refresh operation according to a received signal (operation S523).

If at least one of the plurality of banks 270-0 through 270-(N-1) simultaneously receives a refresh request signal RQS and an external access request signal ACQ, different refresh operations are performed according to whether the requested external access is a write access or a read access. If a refresh operation and an external read access are simultaneously requested, the buffer controller BFC determines whether a buffer-bank hit signal is received (operation S505). If no buffer-bank hit signal is received, the buffer controller BFC transmits present buffer data to a bank corresponding to a present buffer-bank address BFKADD and stores the buffer data in the corresponding bank memory of the bank (operation S507). After storing the buffer data in the bank memory, the buffer controller BFC stores data of a specific bank to which the external read access is requested, in the buffer memory (operation S509), and then allows the specific bank to be refreshed while processing the external read access (operation S513).

If a buffer-bank hit signal is received, the buffer controller BFC determines whether a buffer hit signal is received (operation S511). If a buffer hit signal is received, the buffer controller BFC allows a corresponding bank to be refreshed while allowing the buffer unit to process the external read access (operation S513). However, if no buffer hit signal is received, the buffer controller BFC stores data of the bank to which the external read access is requested, in the buffer memory (operation S509), and then allows the bank to be refreshed while allowing the buffer unit to process the external read access (operation S513).

Alternatively, if a refresh request and an external write access are simultaneously received, the buffer controller BFC determines whether a buffer-bank hit signal is received (operations S515 and S517). If no buffer-bank hit signal is received, the buffer controller BFC transmits buffer data to a bank corresponding to a present buffer-bank address BFKADD, and stores the buffer data to a corresponding bank memory (operation S519). After storing the buffer data in the bank memory, the buffer controller BFC writes data requested to be written into the buffer memory, and allows the bank to be refreshed while allowing the buffer unit to process the external write access (operation S521).

However, if a buffer-bank hit signal is received (operation S517), the buffer controller BFC writes data requested to be written into the buffer memory, and allows the bank to be refreshed while allowing the buffer unit to process the external write access (operation S521).

Figure 6:
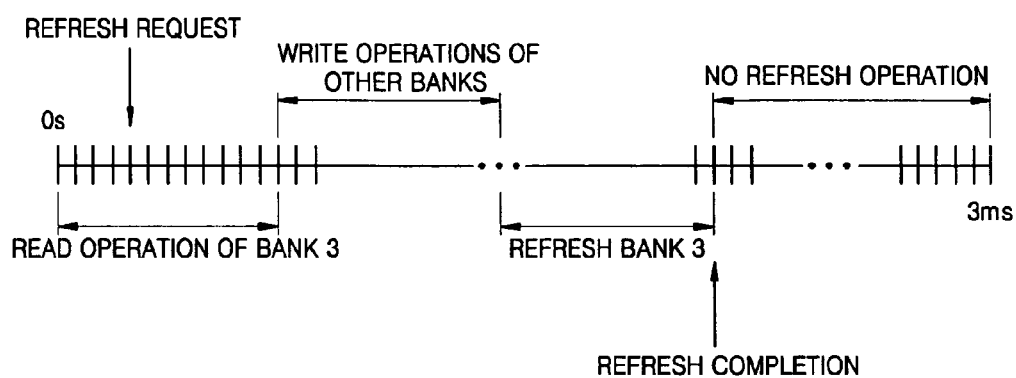
FIG. 6 is a timing diagram illustrating a refresh method according to an embodiment of the present invention

FIG. 6 is a timing diagram when refreshing is performed according to the refresh method according to the embodiment of the present invention. In FIG. 6, a refresh period is 3 ms and a refresh request signal RQS is transmitted per 17 clocks. As shown in FIG. 6, when a start signal of a refresh period is transmitted, a bank 3 has processing a read operation, and while the read operation of the bank 3 is performed, a refresh request signal RQS is transmitted. Here, other banks are refreshed while performing writing operations, however, the bank 3 continuously processes reading accesses and the buffer controller BFC also generates a buffer miss signal in response to an access to the bank 3 so that the bank 3 is maintained in a non-refreshable state.

Thereafter, if the writing and refresh operations of the other banks are complete, the bank 3 monopolizes the corresponding buffer and is successively refreshed until being completely refreshed. Since refreshing of all the banks is complete when refreshing of the bank 3 is complete, no refresh operation is performed until a start signal of a next refresh period is transmitted.

As described above, according to a memory device of the present invention, by refreshing a bank while processing an external access using a buffer when an external access and a refresh operation for the same bank are simultaneously requested, it is possible to efficiently perform a refresh operation. Also, according to the memory device of the present invention, by performing a refresh operation in response to a refresh request signal with a short period, it is possible to ensure refreshing of all banks in a memory to which external accesses are frequently requested.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An integrated circuit memory system, comprising:
   a refresh controller configured to generate a refresh request signal;
   a plurality of banks of memory responsive to the refresh request signal; and
   a buffer unit configured to generate a refresh indication signal to a first one of the plurality of banks of memory and receive buffer write data addressed to the first one of the plurality of banks of memory in response to receiving a refresh-access interrupt signal from the first one of the plurality of banks of memory.

2. The memory system of claim 1, wherein said plurality of banks of memory and said buffer unit are responsive to an external access request signal ACQ.

3. The memory system of claim 1, wherein the first one of the plurality of banks of memory is configured to generate the refresh-access interrupt signal in response to detecting a timing overlap between a read access request and a refresh request signal.

4. The memory system of claim 1, wherein the first one of the plurality of banks of memory is configured to generate the refresh-access interrupt signal in response to detecting a timing overlap between a write access request and a refresh request signal.

5. The memory system of claim 1, wherein the plurality of banks of memory and said buffer unit are separate DRAM chips.

6. A memory device comprising:
a plurality of banks;
a refresh controller generating a refresh start signal for starting a refresh operation and a refresh request signal with a predetermined period;
a buffer unit, which, if a bank simultaneously receiving an external access request signal and the refresh request signal among the plurality of banks exists, generates a refresh indication signal indicating refreshing of the bank while processing an external access to the bank; and
a storage unit storing a buffer-bank address representing an address of a bank in which the same data as data stored in the buffer unit is stored and buffer data validity information indicating whether the data stored in the buffer unit is valid,
wherein the bank transmits a refresh-access interrupt signal to the buffer unit.

7. The memory device of claim 6, wherein each of the plurality of banks comprises:
a bank memory including a plurality of memory cells; and
a bank controller processing an external access or a refresh operation for the bank memory in response to the external access request signal and/or the refresh request signal.

8. The memory device of claim 7, wherein the bank controller comprises:
a bank refresh controller generating a refresh address representing an address of a memory cell in which a refresh operation is performed and outputting the refresh address and the refresh request signal; and
a bank access controller processing an external access to the bank memory or performing refreshing of a memory cell corresponding to the refresh address, in response to the refresh request signal and/or the external access request signal.

9. The memory device of claim 8, wherein the bank refresh controller comprises:
a refresh address generator initialized in response to the refresh start signal, generating the refresh address in response to a refresh completion signal notifying that refreshing is complete from the bank memory; and
a refresh signal transmitter transmitting the refresh request signal and the refresh address to the bank access controller in response to the refresh request signal.

10. The memory device of claim 9, wherein the refresh address generator is a counter.

11. The memory device of claim 9, wherein the bank access controller comprises:
a refresh-access arbitration unit transmitting the refresh-access interrupt signal to the buffer unit, and generating a bank control signal for controlling operations of the bank memory, when receiving the refresh request signal and the external access request signal simultaneously;
a refresh processor refreshing the bank memory in response to the refresh request signal, the refresh address, and the bank control signal; and
an external access processor processing an external access to the bank memory in response to the external access request signal and the bank control signal.

12. The memory device of claim 11, wherein the control signal allows the bank memory to be refreshed in response to the refresh request signal or allows an external access to the bank memory to be processed in response to the external access request signal, when the refresh request signal and the external access request signal are not simultaneously received, and controls an access between the bank memory and the buffer memory and allows the bank memory to be refreshed in response to the refresh indication signal, when the refresh request signal and the external access request signal are simultaneously received.

13. The memory device of claim 6, wherein the buffer unit comprises:
a buffer memory including a plurality of memory cells; and
a buffer controller determining whether the buffer-bank address and the buffer data validity information are valid, processing an external access to the bank simultaneously receiving the external access request signal and the refresh request signal, and transmitting the refresh indication signal to the bank, in response to the refresh-access interrupt signal.

14. The memory device of claim 13, wherein the buffer controller comprises:
a buffer bank validity determination unit comparing the buffer-bank address with an address of the bank, thus determining whether the buffer-bank address is valid, in response to the refresh-access interrupt signal;
a buffer data validity determination unit determining whether the data stored in the buffer unit is valid in response to the buffer data validity information, if it is determined that the buffer-bank address is valid; and
a buffer access controller processing an external access to the bank and transmitting the refresh indication signal to the bank, in response to determination results of the buffer bank validity determination unit and the buffer data validity determination unit.

15. The memory device of claim 14, wherein, if the external access is a write access, the buffer access controller,
if the buffer-bank address is valid, transmits the refresh indication signal to the bank while processing the write access, and
if the buffer-bank address is invalid, stores data stored in the buffer memory in a bank memory of a bank corresponding to the buffer-bank address and transmits the refresh indication signal to the bank while processing the write access.

16. The memory device of claim 14, wherein, if the external access is a read access, the buffer access controller,
if the buffer-bank address is invalid, stores data stored in the buffer memory in a bank memory of a bank corresponding to the buffer-bank address, stores data of a bank to which the read access is requested in the buffer memory, and then transmits the refresh indication signal to the bank while processing the read access,
if the buffer-bank address is valid and the buffer data is invalid, stores the data of the bank to which the read access is requested in the buffer memory and transmits the refresh indication signal to the bank while processing the read access,
if the buffer-bank address is valid and the buffer data is valid, transmits the refresh indication signal to the bank while processing the read access.

17. A refresh method for controlling a refresh operation in a memory device including a plurality of banks and a buffer, comprising:
   after generating a refresh start signal, generating a refresh request signal with a predetermined period;
   determining whether a bank simultaneously receiving an external access request signal and the refresh request signal exists among the plurality of banks;
   if no bank simultaneously receives the external access request signal and the refresh request signal, refreshing the plurality of banks in response to the refresh request signal; and
   if a bank simultaneously receiving the external access request signal and the refresh request signal exists, transmitting a refresh-access interrupt signal to the buffer unit, and refreshing the bank while allowing the buffer unit to process the external access.

18. The refresh method of claim 17, wherein, if the external access is a write access, the refreshing the bank comprises;
   determining whether a buffer-bank address representing an address of a bank storing the same data as buffer data stored in the buffer unit is valid;
   if the buffer-bank address is valid, refreshing the bank while allowing the buffer unit to process the write access; and
   if the buffer-bank address is invalid, storing the buffer data in a bank corresponding to the buffer-bank address, and refreshing the bank while allowing the buffer unit to process the write access.

19. The refresh method of claim 17, wherein, if the external access is a read access, the refreshing the bank comprises:
   determining whether a buffer-bank address representing an address of a bank storing the same data as buffer data stored in the buffer unit is valid;
   if the buffer-bank address is invalid, storing the buffer data in a bank corresponding to the buffer-bank address, storing data of a bank to which the read access is requested in the buffer unit, and then refreshing the bank while allowing the buffer unit to process the read access; and
   if the buffer-bank address is valid, determining whether the buffer data stored in the buffer unit is valid, and refreshing the bank while allowing the buffer unit to process the read access.

20. The refresh method of claim 19, wherein the determining whether the buffer data is valid and refreshing the bank comprises:
   determining whether the buffer data is valid;
   if the buffer data is valid, refreshing the bank while allowing the buffer unit to process the read access; and
   if the buffer data is invalid, storing the data of the bank to which the read access is requested in the buffer unit, and refreshing the bank while allowing the buffer unit to process the read access.

* * * * *